United States Patent
Cavalheiro Vieira et al.

(10) Patent No.: US 6,654,401 B2
(45) Date of Patent: Nov. 25, 2003

(54) MULTIPLE LASER SOURCE, AND SYSTEMS FOR USE THEREOF

(75) Inventors: Amarildo Jesus Cavalheiro Vieira, Philadelphia, PA (US); Peter Robert Herczfeld, Philadelphia, PA (US); Vincent Michael Contarino, Solomon, MD (US); Yifei Li, Norwood, PA (US); Linda Jeanne Mullen, Chesapeake Beach, MD (US)

(73) Assignee: F & H Applied Science Associates, Inc., Mt. Laurel, NJ (US)

(*) Notice: Subject to any disclaimer, the term of this patent is extended or adjusted under 35 U.S.C. 154(b) by 316 days.

(21) Appl. No.: 09/811,320

(22) Filed: Mar. 17, 2001

(65) Prior Publication Data

US 2002/0018494 A1 Feb. 14, 2002

Related U.S. Application Data

(60) Provisional application No. 60/223,765, filed on Aug. 8, 2000.

(51) Int. Cl.[7] .................... H01S 3/091; H01S 3/10; H01S 3/115
(52) U.S. Cl. .................. 372/70; 372/9; 372/12; 372/71
(58) Field of Search ................... 372/9, 12, 70–71

(56) References Cited

PUBLICATIONS

Vieira, Amarildo, "Optical Transmitter with Millimeter–wave Subcarrier", thesis paper, Drexel University, Jun. 1997.*

Herczfeld et al. "Modelocked Microchip Laser with Millimeter Wave Subcarrier", International Topical Meeting on Microwave Phontonics, Sep. 3–5, 1997, pp. 63–66.*

Li et al. "Optical Generation of rapidly tunable millimeter wave subcarrier", SBMO/IEEE MTT–S IMOC '99 proceedings, Aug. 12, 1999, pp. 645–647.*

Vieira et al. "Nd:LiNbO3 Microchip Laser with 20 GHz Subcarrier." 1997 IEEE MTT–S Digest, vol. 1, Jun. 8–13, 1997, pp. 229–232.*

Vieira et al. "20 GHz modelocked Nd:IiNbO3 microchip laser", Conference on Lasers and Electro–Optics, May 18–23 1997.*

* cited by examiner

*Primary Examiner*—Paul Ip
*Assistant Examiner*—James Menefee
(74) *Attorney, Agent, or Firm*—Buchanan Ingersoll, P.C.

(57) ABSTRACT

A chirp signal source includes first and second lasers formed on a solid-state chip or substrate. Each of the lasers has a resonator or cavity which incorporates or includes electrooptic material which changes refractive index in response to an electric field. The lasers are pumped, and the resulting laser beams are coupled to a light-to-electric converter which combines the light beams to generate an electrical difference frequency. The change in refractive index allows the lasers to be swept or chin,ed at a much higher rate than thermal or piezoelectrically operated lasers. This structure has the advantages of tending to reduce temperature effects on the difference frequency. It has the further advantage of a high sweep rate, which can be used to improve the signal-to-noise ratio. A radar or lidar ranging system according to an aspect of the invention uses multiple solid-state lasers, which are thermally coupled together.

9 Claims, 6 Drawing Sheets

MULTIPLE LASER SOURCE, AND SYSTEMS FOR USE THEREOF

This application claims the benefit of application No. 60/223,765 filed on Aug. 8, 2000.

FIELD OF THE INVENTION

This invention relates to solid-state lasers, and more particularly to solid-state laser arrangements capable of fast wavelength or frequency tuning (scanning).

BACKGROUND OF THE INVENTION

Microwave and millimeter-wave electrical signals are desirable for various types of range detection, medical and communications equipment. Ranging equipment or radar for automobile collision prevention and for medical applications such as small tumor detection has been under development, and such equipment often uses millimeter-wave radiation, which is more suitable for short-range ranging than are longer wavelengths, at least in part because the equipments required to process millimeter-wave signals tend to be quite small and light in weight, and also because the millimeter waves provide higher accuracy. One type of radar system which has been used for automotive collision detection is swept-frequency radar, in which the frequency of the transmitted radiation recurrently varies in a linear manner between a low frequency and a high frequency. It should be noted that those skilled in the art know that frequency and wavelength are related by the speed of light, so reference to frequency or frequencies is also a reference to wavelength or wavelengths. This frequency scanning is known as "chirp" or "chirping," a reference to the sound made by an audio tone performing the same kind of frequency scanning.

In a ranging radar system, a portion of the transmitted signal is reflected by the target, and returned to the radar transmitter. At the transmitter, the timing of the returned signal is compared with the time of the transmitted signal in order to determine the range or distance at which the target was when the signal was reflected. In a pulse radar system, the transmitted signal is in the form of recurrent pulses of energy, and the time lapse between the transmitted pulse and the received reflected signal is a measure of the distance. In swept-frequency or chirp systems, signals are transmitted continuously or almost-continuously, at least during selected intervals. The time lapse between the transmitted signal and the received reflected signal is determined by comparing the current frequency of the transmitter signal with the frequency of the received reflected signal. The frequency difference between the current transmitter frequency and the frequency of the returned signal is a measure of the time difference, and therefore of the range. The signal processing for such a system is simplified if the each of the recurrent frequency sweeps is linear with time, so that a given frequency difference always represents the same target range; a small frequency difference corresponds to a short target range, and a large frequency difference corresponds to a large target range.

In the context of radar for automotive collision monitoring or control, the ranges are relatively short, with the maximum range being on the order of a hundred feet or less, corresponding to round-trip signal transit durations (also known as radar range) of about 0.2 microsecond, or 200 nanoseconds (ns). Thus, the maximum round-trip transit time is about 200 nanoseconds, and the system must respond to changes in range at much shorter distance, which is to say that the range resolution must be good. Good range resolution, in turn, implies a large frequency excursion of the swept signal. Also, high signal-to-noise ratio is desirable. One of the problems attendant on the use of swept-frequency radar systems is that the frequency difference between the transmitted signal and the received signal tends to be relatively small at short target ranges. This frequency difference is the signal with which signal processing begins in order to determine the range. The frequency difference for short-range targets arises because of the difficulty of achieving a large frequency scan or sweep within the short time before the return signal arrives.

It is an inconvenient fact that solid-state amplifiers tend to have inherent noise which follows a 1/f or inverse frequency characteristic. That is, the inherent noise of the devices is greatest at low frequencies, and decreases at high frequencies. Thus, it is desirable to receive a relatively high-frequency range-representative signal at the beginning of signal processing in order that the processing itself not add to the noise already extant in the returned signal. This problem may be addressed by measuring only longer ranges, or by reducing the signal processing noise.

Improved systems are desired.

SUMMARY OF THE INVENTION

A laser arrangement according to an aspect of the invention includes a first solid-state laser formed on a chip. For convenience, this laser arrangement is referred to a "chirp" or "chirped" laser arrangement, although some embodiments do not actually frequency scan. The first solid-state laser has a particular optical or electrooptical cavity length, and at least a portion of the cavity of the first solid-state laser includes electrooptic material. The chirp laser arrangement also includes a second solid-state laser, also formed on the same chip, and having the same or particular optical or electrooptical cavity length. At least a portion of the cavity of the second solid-state laser also includes the electrooptic material. Ideally, the first and second solid-state lasers are as identical as can be achieved by the use of batch processing, and the cavities are arranged, as known in the art, so that only one (or possibly a few) longitudinal modes are generated. The purpose of forming the lasers on the same chip is to allow them to be made as identical as possible, which also has the salient advantage of coupling them together thermally, so that changes in the environmental temperature tends to affect both the first and second lasers equally. The chirped laser arrangement includes first and second optical pumps having nominally the same pump frequency, and an optical coupling arrangement or means coupled to the first and second optical pumps and to the first and second solid-state lasers, for pumping the first and second lasers with similar pump light, so that, or whereby, the first and second lasers produce first and second laser light beams. If it were possible to make the structures identical, the laser light pump beams should be at the same wavelength or frequency. In one avatar of the invention, the first and second pump light sources are in the form of a single pump light source, with an optical power divider dividing the pump power so as to apply equal powers to the first and second lasers, this tends to apply changes in pump power or wavelength equally to the first and second lasers, so that the frequencies or wavelengths of the first and second light beams tend to track each other notwithstanding changes in the pump source parameters. The chirped laser arrangement also includes a nonlinear light-to-electric converter, such as an photodetector (an electrooptic diode), which, in the presence of plural light signals at different frequencies or wavelengths, generates electrical signals at frequencies related to the difference. More specifically, if two laser light beams impinge on the photodetector diode, an electrical signal is produced which is at a frequency equal to the difference between the frequencies of the two light beams, and if it should happen that the frequencies of the two light beams were identical, the resulting electrical signal at the output of the electrooptic diode would be zero frequency or "direct current." The chirp or chirped laser arrangement also includes a second optical coupling arrangement or means coupled to the first and second lasers, and coupled to the light-to-electric converter or photodiode, for coupling the first and second laser light beams to the light-to-electric converter or photodetector, whereby the light-to-electric converter generates at least one electrical difference signal. According to one aspect of the invention, in which the ranging system is a swept-frequency radar type, the second coupling path may include, for example, an optical power combiner or directional coupler such as a star coupler, together with optical fibers extending from the light output ports of the first and second lasers to input ports of the optical power combiner for carrying the first and second laser light beams to the optical power combiner, directional coupler or star coupler, and another optical fiber extending from an output port of the optical power combiner, directional coupler or star coupler to the photodiode or electrooptic diode, for carrying the two laser beams to the electrooptic diode; in this radar context, the electrical difference frequency generated at the diode is then amplified, if necessary, and transmitted as an electromagnetic signal. According to another aspect of the invention, the context is a lidar (light detection and ranging) system, in which the second optical coupling path includes the optical combiner or directional coupler (star coupler), and the light paths between the first and second lasers and the optical power combiner, directional coupler or star coupler, but in which the combined first and second laser light beams at the output of the optical combiner are transmitted over the path to be measured, and reflected by the intended target. In this lidar context, the second optical coupling path also includes a receiving arrangement for picking up or sensing the reflected first and second light beams, and for conveying the reflected and returned first and second light beams to the nonlinear light-to-electric converter or photodetector. The photodetector then converts at least the first and second returned light signals into an electrical difference signal, and further processing can be performed by electronic means to determine the range of the target. According to a further aspect of the invention, an electrode is associated with at least a portion of the electrooptic material of the second laser, for, when electrically energized, electrooptically affecting the length of the cavity of the second laser, thereby affecting the wavelength of the laser light beam of the second laser, which in turn affects the frequency of the electrical difference signal at the output of the photodiode or other nonlinear light-to-electric converter.

In particularly advantageous versions of the lidar and radar embodiments, a constant electrical value, as for example a constant voltage, is applied to the electrode of the second laser, to thereby produce a constant frequency or wavelength offset of the second laser light beam relative to the first laser light beam. In a particular manifestation of these versions, the electrical value applied to the electrode coupled to the electrooptic portion of the second laser cavity is selected so that the nominal electrical difference frequency at the output of the light-to-electric converter is closer to those frequencies at which the electronic processing devices have lowest noise. This improves the signal-to-noise ratio, thereby allowing better range resolution than if no constant electrical value were applied to the electrode of the second laser. Of course, the difference frequency may be selected to be some other value based upon some criterion other than signal-to-noise ratio.

In yet a further manifestation of the invention, the first laser also includes an electrode coupled to the electrooptic portion of its cavity. The constant electrical value is applied to one of the first and second electrodes to provide a constant frequency or wavelength offset between the first and second laser light beams, and a ramp-like or information electrical signal(s) is applied to the other of the first and second electrodes. This has the advantage of reducing electrical coupling between the ramp- or information-signal source and the constant-value electrical source, while allowing the first and second laser light beams to be mutually offset and modulated in a useful manner.

BRIEF DESCRIPTION OF THE DRAWING

FIG. 1b is a schematic representation of an alternative pump light source which can be used in the arrangement of FIG. 1a;

DESCRIPTION OF THE INVENTION

Another way to improve the signal-to-noise ratio of a radar or lidar system in the context of short-distance ranging systems is to improve the frequency sweeping rate. In order to perform signal processing at a higher frequency for lower noise contribution by the signal processing itself, the frequency difference between the transmitted and reflected/received signal must be larger. That is to say, that if, in the time representing the shortest distance to be measured (the shortest time), there is a larger frequency or wavelength difference between the transmitted and received signal, then the difference frequency will be larger. This, in turn, means that it is desirable to have a laser source which changes frequency as rapidly as possible. In other words, the derivative of the frequency versus time (df/dt) should be maximized. Mode locked lasers produce high-quality laser light beams with low noise, but the mode locking is inherently narrow-band, which tends to slow df/dt. Tunable optical transmitters using optical heterodyning techniques have tended to be slow, because of the mechanisms used to effectuate the frequency scan. For example, the application of heat or thermal energy to a solid-state laser will cause the laser light beam to change in frequency or wavelength, but the thermal lags involved in heating the mass of the laser and its substrate make for low df/dt. Also, the reference laser is subject to stray thermal effects, which makes for difference-frequency instability. Similarly, piezoelectric (PZT)-tuned lasers have been attempted in a heterodyne context, but piezoelectric effects are inherently slow.

Figure 1A:
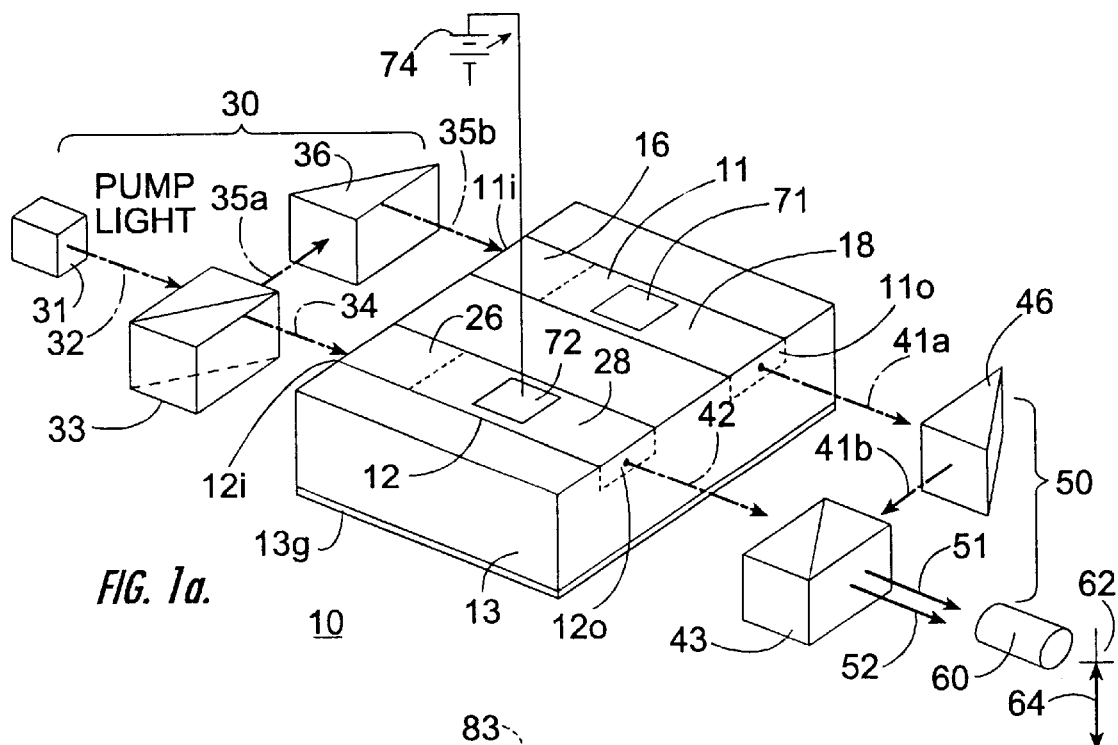
FIG. 1a is a simplified representation of two lasers formed as part of a monolithic or solid state chip, with ancillary equipment required for operating the lasers to form mutually parallel or superposed laser beams.

FIG. 1a is a simplified perspective or isometric view of a chirped laser system 10 according to an aspect of the invention. In FIG. 1a, a "chip" 13 carries a first laser 11 including a gain section 16 and a cavity or resonator section 18. Similarly, chip 13 carries a second laser 12, which includes a gain section 26 and a cavity or resonator section 28. At least a portion of each cavity 18 and 28 includes an electrooptic material, such as lithium niobate (LiNbO3), which has electrooptic characteristics. More particularly, the refractive index of lithium niobate is a function of the electric field within the material. Fabrication of large numbers of identical electrooptic structures by batch processing of solid-state wafers is well known, and is not part of the invention. The structure 13 of FIG. 1a is a chip including at least the two illustrated lasers, cut or broken away from a larger wafer on which many such lasers are fabricated in arrays.

Each laser 11 and 12 of FIG. 1a has an input port or region 11i and 12i, respectively. Pump light for lasers 11 and 12 is generated by a pump light source arrangement designated generally as 30. Pump light source 30 includes a source of light illustrated as a block 31, which projects the pump light along a path 32 to an optical power splitter illustrated as a partially reflecting or half-silvered mirror arrangement 33, which partially reflects the light, and splits it into a first beam 34 and a second beam 35a. Light beam 34 enters laser 12 light input port 12i, and light beam 35a enters a prism 36, which redirects beam 35a (as pump light beam 35b) to input port 11i of laser 11. Each laser 11 and 12 of FIG. 1a has an output port 11o and 12o at which laser light is generated during operation. The laser light beam 41a produced by laser 11 leaves output port 11o, enters a further prism 46 of an optical power combining arrangement 50, and is redirected therein to form light beam 41b. Light beam 41b enters an optical combiner 43, which is similar to partially reflecting mirror arrangement 33, and is reflected to form a first laser output beam 51. The laser light beam 42 produced at output port 12o of laser 12 passes directly through partially reflecting mirror arrangement 43 to produce an output laser light beam 52. Proper alignment of the prism 46 and partially reflecting mirror 43 of power combining arrangement 50 allows laser light beams 51 and 52 to be spatially superposed.

Laser 11 includes a gain portion 16 and a further optical resonator or "cavity" portion 18, as known in the art. Laser 12 includes a similar gain portion 26 and optical resonator portion 28. Each of the resonators 18 and 28 contains electrooptic material which changes index of refraction in response to an applied electric field. In a particular embodiment of this aspect of the invention, the electrooptic material is lithium niobate ($LiNbO_3$). Construction techniques are known for fabrication of monolithic lasers with electrooptic materials in the resonator region.

In operation of the arrangement 10 of FIG. 1a, each laser 11, 12 is energized with electric power in known fashion, and the pump source 31 produces pump light. The pump light is split into two separate beams or portions 34, 35b. Pump light portion 35b is applied to the pump light input port 11i of laser 11, and pump light portion 33 is applied to light input port 12i of laser 12. The pump light is amplified by the gain portions 16, 26 of lasers 11 and 12, and resonator portions 18, 28 act as resonators, as known in the laser arts, to produce the laser output beams 41a, 42. Laser output beams 41a and 42 are combined within optical combiner 50 to produce two mutually parallel or superposed laser beams 51, 52 at the output of the combiner.

In FIG. 1a, the two combined light beams 51, 52 produced by the lasers 11 and 12 in conjunction with optical power combiner 50 are directed through an optical path designated as 60, illustrated as a piece of optical fiber, although it may be free space, to an electrooptic converter or photodetector illustrated by a diode symbol 62. Photodetector 62 produces an electrical signal at a frequency related to the difference in frequency between the two laser light beams or light beam modes 51 and 52, and couples the resulting electrical signal over a path illustrated as 64 to a utilization apparatus. Those skilled in the art know that the electrooptic converter must have a nonlinear characteristic in order to generate the desired mixed or difference signals.

Those skilled in the laser arts know that the output wavelength of a laser depends upon a number of factors in addition to the length of the cavity and the mode number. In particular, the temperature of the laser has an effect on the wavelength, and in fact temperature has been used as a control variable for tuning laser wavelength. Since the gain materials, and possibly other materials of the laser are nonlinear with amplitude, the wavelength is also dependent upon the pump light power. Physical stresses may also have an effect on the output wavelength of the laser light. As so far described, the lasers 11 and 12 of FIG. 1a are as identical as they can be made with modern batch processing techniques as applied to wafers, they are pumped with pump light which is as similar as can be achieved. As a result, the laser light beams 51 and 52 should, in principle, be at the same wavelength. Of course, the limits of fabrication technology do not permit exact matching. A salient advantage of the arrangement 10 of FIG. 1 as so far described is that the small size of batch-fabricated lasers results in their being very close to each other, and the substrate materials are chip 13 are relatively good thermal conductors. Consequently, the two lasers are in good thermal communication with each other. In other words, the temperatures of the two lasers 11 and 12 tend to track each other. As a consequence, environmental temperature variations cannot affect one of the lasers more than the other, and while wavelength changes may occur, they will tend to track, so that the wavelengths of the laser light beams 51, 52 tend to remain the same notwithstanding environmental temperature changes.

When photodetector 62 of FIG. 1a receives two laser light beams at substantially equal wavelengths, it produces electrical energy at a frequency equal to the frequency difference between the two laser light beams. It should be noted that the wavelength ($\lambda$) of light is related to its frequency (f) by the speed of light (c) by $\lambda = c/f$. When the laser light beams are at exactly the same wavelength, the electrical output of photodetector 62 has zero frequency, corresponding to "direct current." This is not a particularly useful result.

According to an aspect of the invention, the structure 13 of FIG. 1a further includes at least one electrode, illustrated as 72, overlying at least a portion of the electrooptic material within resonator 28. A control voltage source 74, illustrated by a "variable battery" symbol, is coupled to the electrode. The voltage applied to the electrode 72 from control source 74 creates an electric field between electrode 72 and a reference voltage level such as ground, which is associated with the chip 13. The ground reference structure is illustrated in FIG. 1a as an electrically conductive "ground" layer 13g affixed to the bottom of the chip or substrate. The electric field produced by a voltage applied to electrode 72 affects or changes the index of refraction of the electrooptic material of resonator 28, resulting in a change in the effective optical length of the resonator 28. This change in the effective optical length, in turn, affects the wavelength of the resulting laser beam.

While independent or separate laser pump light sources could be used, separate units are inherently prone to independent changes in optical power and pump wavelength. By contrast, in the arrangement of the pump source 30 of FIG. 1a, a change in optical pump power applied to one of the lasers 11, 12 is likely to produce an equivalent change in the pump power of the other one, thereby tending to maintain the tracking between the laser light beam wavelengths.

Figure 1B:
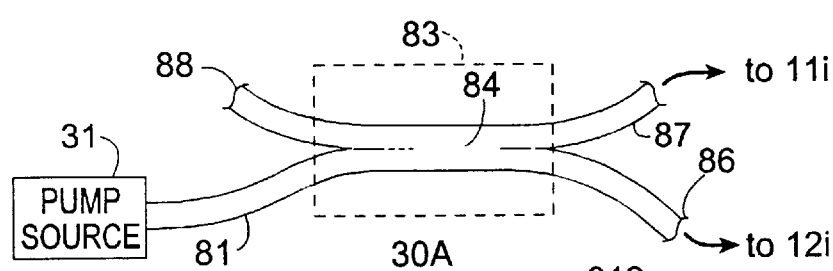

FIG. 1b illustrates another possible configuration 30A of a light splitter which could be used in the arrangement of FIG. 1a. In FIG. 1b, the light from pump source 31 is applied to an optical fiber 81, which couples the light to an optical splitter or directional coupler 83, herein referred to as a "star" coupler. Directional coupler 83 consists of a fusion of optical fiber 81 to a second optical fiber along a fusion region 84. Those skilled in the art know that light produced by pump source 31 of FIG. 1b propagates to output optical fiber portions 86 and 87, and not to optical fiber portion 88. Thus, the optical directional coupler or star 83 of FIG. 1b is the equivalent of the optical power divider 30 of FIG. 1a. The optical directional coupler arrangement 30A can also be used as a power combiner, as a replacement for power combiner 50 of FIG. 1. For such a use, the laser output ports 11o and 12o of FIG. 1 would be coupled to optical fibers 86 and 87 of FIG. 1b, and the combined signal would be taken from optical fiber 31 or 88.

Figure 2:
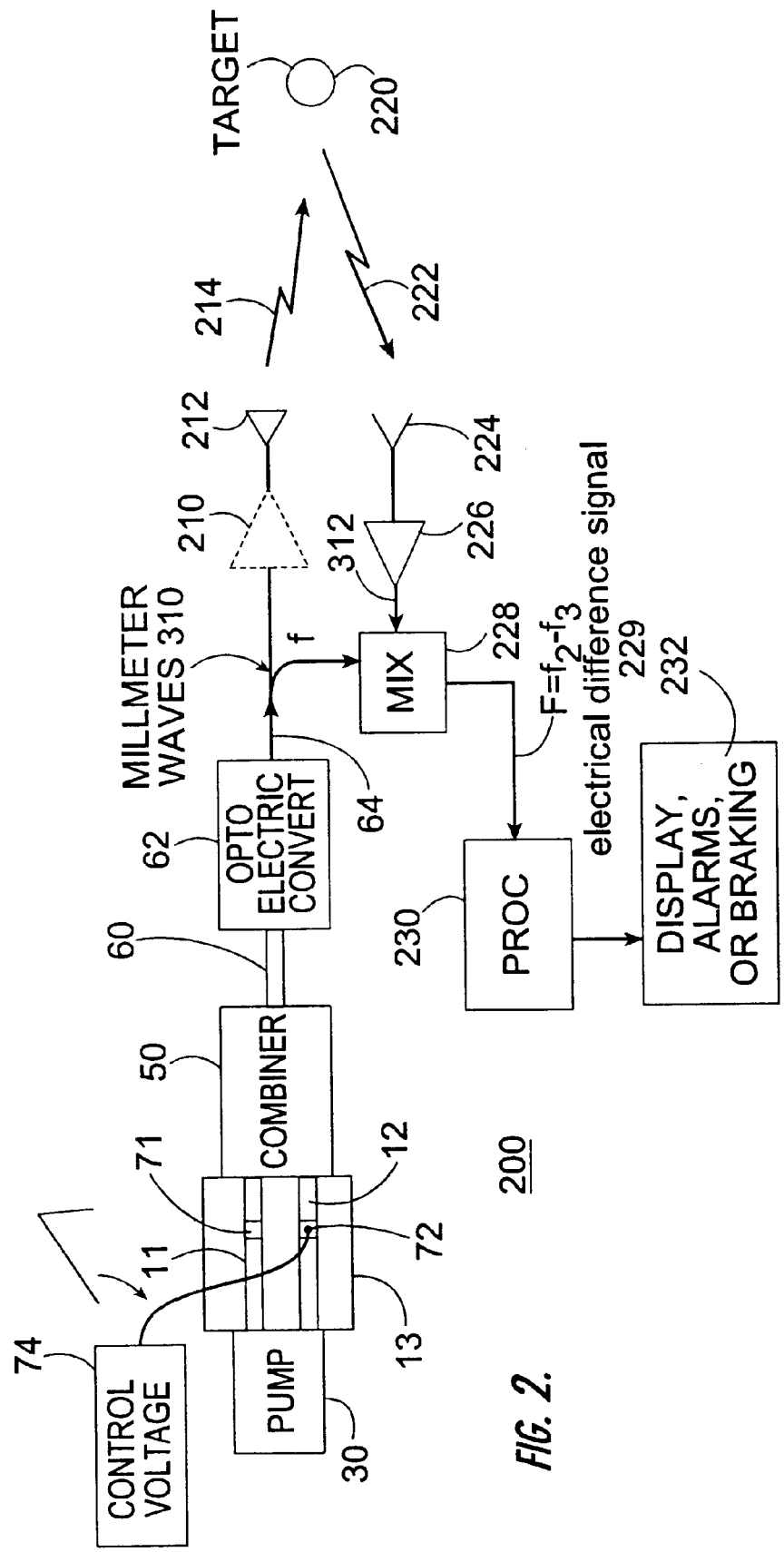
FIG. 2 is a simplified block diagram of a chirped radar system in which the chip of FIG. 1 is used to generate the chirp signal.

FIG. 2 is a simplified block diagram of a swept-frequency or chirped radar system which uses the arrangement of FIG. 1a to generate the chirp signal. In FIG. 2, elements corresponding to those of FIG. 1a are designated by the same reference designations. In FIG. 2, lasers 11 and 12 on solid state chip or substrate 13 are pumped by pump light source 30 as described in conjunction with FIG. 1a, and a control signal is applied from a control source 74 to an electrode 72 associated with laser 12. The two resulting light beams are combined by structure 50, and the light is sent over a path 60 to a photodetector 62, which produces electrical difference signals on a signal path 64. In the arrangement of FIG. 2, control voltage source 74 produces a recurrent ramp-like voltage waveform, which causes the wavelength of the laser beam 52 to change as a function of time. Assuming that the change in wavelength from a rest or no-voltage wavelength is linearly related to the applied voltage, photodetector 62 receives laser light beam 51 at a constant wavelength, and laser light beam 52 at a wavelength which recurrently changes with time. As a result, the electrical signal produced on signal path 64 of FIG. 2 recurrently sweeps or chirps from one wavelength to another. For certain wavelengths of light, the electrical signal on path 64 sweeps through frequencies in a band of frequencies known as "millimeter-wave" frequencies, on account of the wavelength of the signals. It should be understood that the wavelength of the electrical signal is dependent upon or related to the wavelengths of the applied light signals.

The millimeter-wavelength electrical signals generated by photodetector 62 of FIG. 2 are applied to a transmit antenna 212, by way of an amplifier 210 if necessary. The electrical radar transmit signal is transmitted in the form of electromagnetic radiation, illustrated by a "lightning bolt" symbol 214, toward a target 220. The target 220 reflects a portion of the transmitted signal 214 to generate a reflected signal, which travels as electromagnetic radiation 222 back towards a receiving antenna 224. A portion of the reflected or returned electromagnetic radiation 222 is received by antenna 224, and a corresponding signal is coupled by way of a low-noise amplifier 226 to an electrical mixer 228, which may be a simple nonlinear device, as known in the art. Mixer 228 receives the reflected or returned signal sample, and also receives a sample of the electrical millimeter waves currently being produced by photodetector 62 for transmission. Mixer 228 mixes the two signals, and produces a "heterodyne" signal at a frequency or band of frequencies which represents any difference between the transmitted frequency and the received frequency.

FIG. 3 includes a plot 310 of frequency versus time, representing the frequency of the millimeter-wave electrical signal generated by electrooptic converter 62 of FIG. 2 during repetitive cycles of operation. In FIG. 3, the length of each recurrent cycle is determined by the round-trip time duration required (disregarding internal delays in the processing) for the transmitted signal to reach the target and return, when the target is at its maximum range. That is, the duration of the recurrent cycle should be much larger than the round-trip time duration required (disregarding internal delays in the processing) for the transmitted signal to reach the target and return when the target is at maximum range. Thus, if the maximum range for an automotive radar is 100 feet, the round-trip time duration has been calculated above to be about 200 nanoseconds. This means that each recurrent cycle 310a, 310b, 310c, . . . has a time duration of 200 nanoseconds. Note that there is a time period between the chirp intervals. This interval may be used to avoid interaction or false reading due to interpreting reflected signals from a prior transmission as being associated with the current transmission. Within each recurrent cycle of 200 nsec duration, the frequency sweeps or chirps from frequency f1 to a higher frequency f2.

Figure 3A:
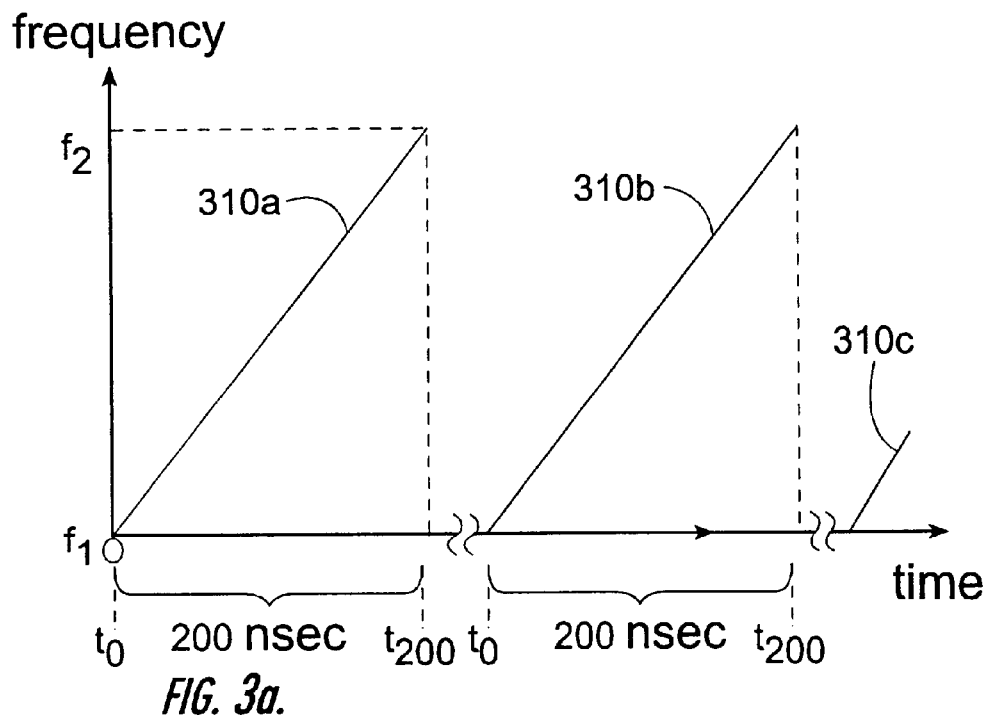
FIG. 3a is a plot of frequency versus time for the transmitted signal in one example of a chirp radar for use within a particular range.
Figure 3B:
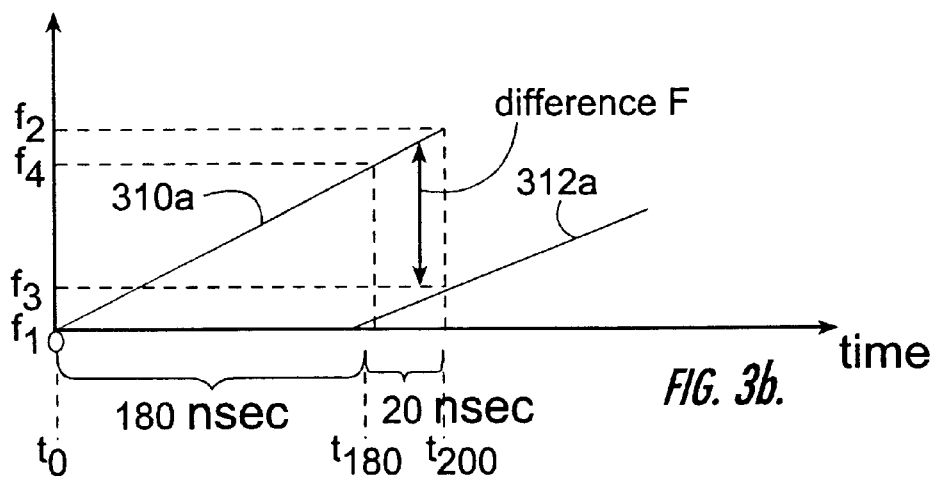
FIGS. 3b and 3c are plots of the transmitted and received signals for one cycle of operation at long and short ranges, respectively.

FIG. 3b is a representation of a single one of the recurrent transmitted cycles of FIG. 3a, namely cycle 310a, plotted together with the reflected signal 312a arriving at mixer 228 of FIG. 2, when the target is at a range of about 90 feet, just short of the 100-foot design maximum range. As illustrated, that portion of the returned or reflected signal transmitted at time t0 begins to arrive at the mixer 228 after 180 nsec, or at time t180. Since the frequency of the signal originally transmitted at time t0 was f1, the reflected signal arriving at mixer 228 at time t180 has frequency f1. Mixer 228 mixes the currently transmitted signal with the returned signal to make a difference-frequency signal F at a frequency which can be represented as F=f2−f3 or F=f4−f1. Since linear ramp signals with time have been assumed, these values of F are the same. As illustrated in FIG. 3b for the situation of a target at near the maximum range, frequency F is relatively large.

Figure 3C:
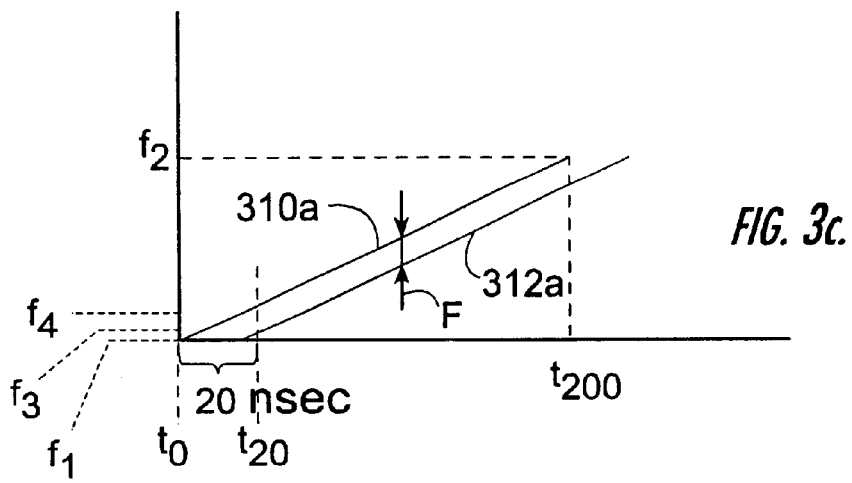

FIG. 3c is a representation of a single one of the recurrent transmitted cycles of FIG. 3a, namely cycle 310a, plotted together with the reflected signal 312a arriving at mixer 228 of FIG. 2, when the target is at a range of about 10 feet. As illustrated, that portion of the returned or reflected signal transmitted at time t0 begins to arrive at the mixer 228 after 20 nsec, or at time t20. Since the frequency of the signal originally transmitted at time t0 was f1, the reflected signal arriving at mixer 228 at time t20 has frequency f1. Mixer 228 of FIG. 2 mixes the currently transmitted signal with the returned signal to make a difference-frequency signal F at a frequency which, as in the case of FIG. 3b, can be represented as F=f2−f3 or F=f4−f1. Again, since linear ramp signals with time have been assumed, these values of F are the same. As illustrated in FIG. 3c for the situation of a target at near the minimum range, frequency F is relatively small. As described above, random noise tends to make it difficult to process signals generated from short-range targets to achieve reliable or consistent measurements.

Figure 4:
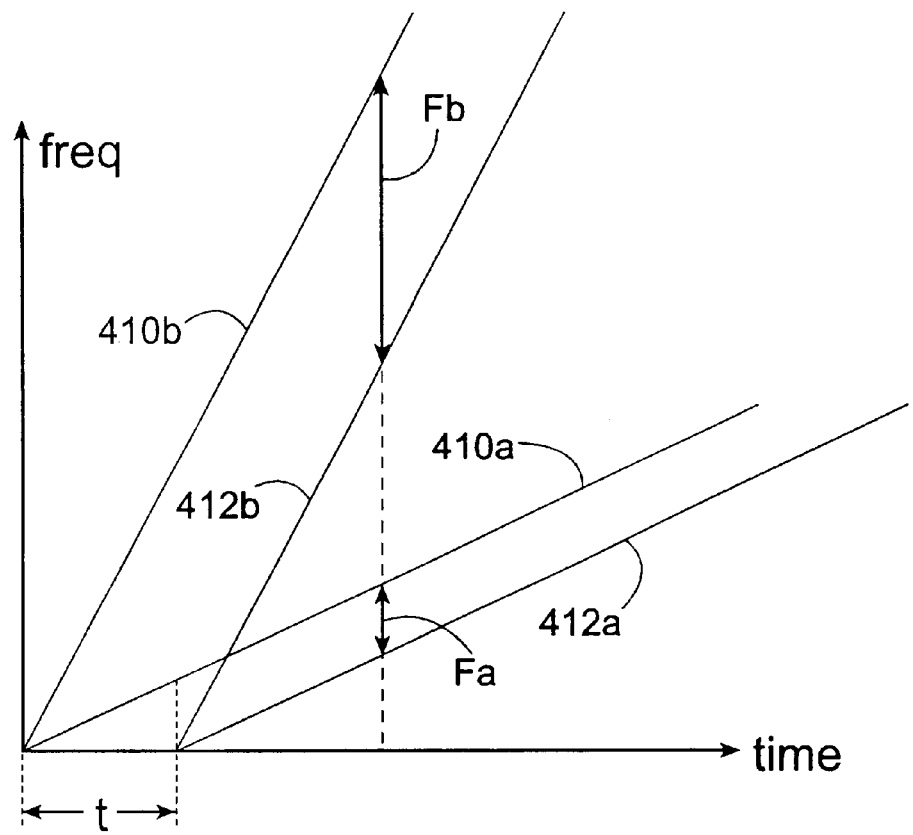
FIG. 4 is a plot illustrating the frequency difference at a given range for a chirp radar for the case of relatively large frequency change versus time by comparison with a relatively small frequency change versus time.

FIG. 4 plots the transmitted and received signals for a chirp radar for a target at a distance t, where the rate of change of the chirp frequency is the parameter. Plot 410a is for a relatively low or small rate of change of frequency versus time. Plot 412a is the corresponding returned or reflected signal for a target at a distance corresponding to time t. The frequency $F_a$ represents the difference frequency generated by mixer 228 of FIG. 2. In FIG. 4, plot 410b is for a relatively great or large rate of change of frequency versus time. Plot 412b is the corresponding returned or reflected signal for a target at a distance corresponding to time t. The frequency $F_b$ represents the difference frequency generated by mixer 228 of FIG. 2. As can be easily seen, the magnitude of the frequency difference $F_b$ is greater than the frequency difference $F_a$, meaning that, in order to maximize the frequency of the difference signal regardless of the range of the target, the rate of change of frequency versus time of the resulting laser wavelengths must be maximized. As mentioned, use of temperature to tune one of the lasers provides a very slow scan, and piezoelectric techniques for tuning are also slow. The structure of the monolithic laser chip of FIG. 1a, with the electrooptic change of index of refraction, provides a much greater rate of change than either thermal or piezoelectric tuning. Thus, in the context of a chirp radar for short ranges, the monolithic or solid-state structure of FIG. 1a provides better overall operation than prior-art arrangements, because the difference frequency is larger at all ranges, and the signal processing performed in block 230 of FIG. 2 to perform the calculations can be performed on a higher-frequency signal for lower noise. Once the target range and rate of change of target range (closing rate) has been determined, the processor 230 of FIG. 2 sends signals to utilization apparatuses illustrated as a block 232. Block 232 may represent display of the distance, the giving of an alarm if the closing rate is indicative of a potential collision, or it may apply the brakes, reduce acceleration, or take other action.

In the context of an automotive or like anticollision radar, the monolithic laser structure is sturdy and not prone to breakage, and due to the matching of the laser devices on the chip, ambient temperature changes should not cause such drift in the frequency of the resulting transmitted signal that the device becomes useless. Temperature control of the chip and or of the pump source is possible if better control is desired.

Figure 5:
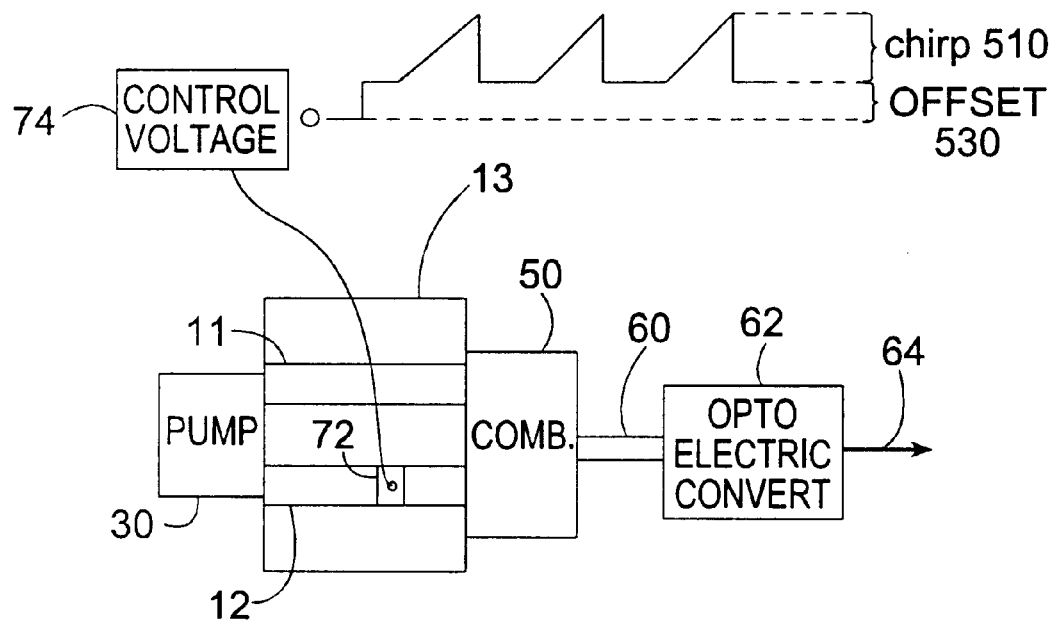
FIG. 5 is a simplified block diagram of a millimeter-wave generator similar to that of FIG. 1, in which the electrical signal applied to the laser electrode is in the form of a step-function of long duration (an offset voltage) upon which is superposed a ramp signal of FIG. 4.

According to another aspect of the invention, an offset frequency is intentionally introduced by applying a fixed bias voltage to the electrode of a laser. FIG. 5 is a simplified block diagram of a millimeter-wave generator similar to that of FIG. 1, in which the electrical signal applied to the electrode 72 of laser 12 is in the form of a step-function of long duration (an offset voltage) upon which is superposed the ramp signal 410b of FIG. 4. The effect of the presence of the ramp signal is to introduce a fixed wavelength offset between the laser beams, which in turn can be used to adjust the "center" frequency on which the frequency sweep of the electrical difference signal is centered, or the base frequency from which the sweep starts. The arrangement of FIG. 5 includes a receiver 580.

Figure 6:
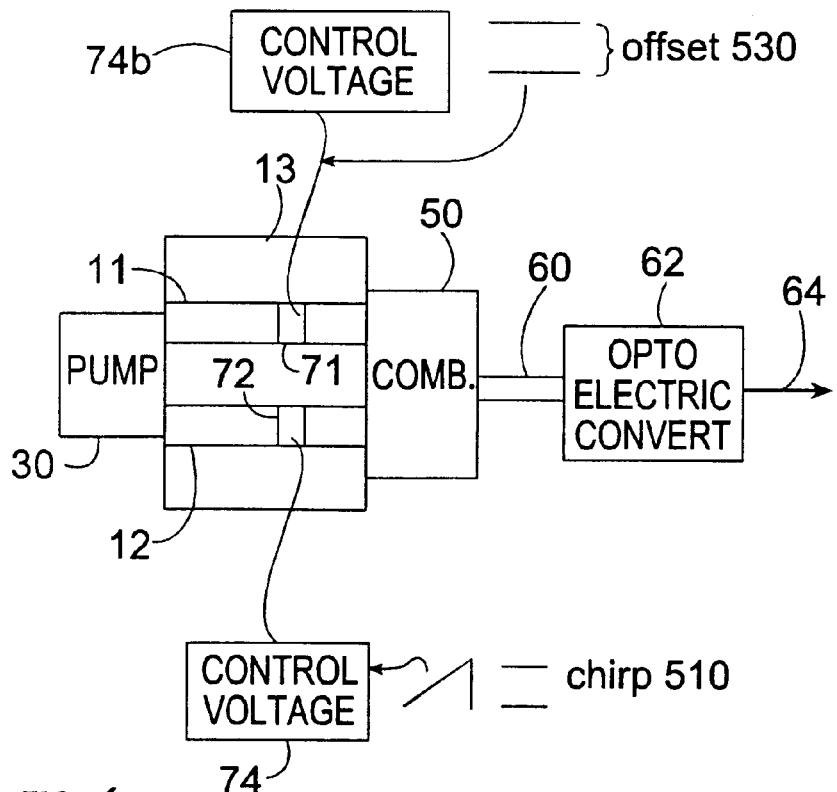
FIG. 6 is similar to FIG. 5, but includes a further control voltage generator.

FIG. 6 is similar to FIG. 5, but includes a further control voltage generator 74b. In the arrangement of FIG. 6, the fixed wavelength offset is provided by the fixed or "direct current" (DC) voltage applied from generator 74b to the electrode 71 associated with first laser 11, and the chirp is provided by the ramp voltage 510 provided by generator 74.

Figure 7:
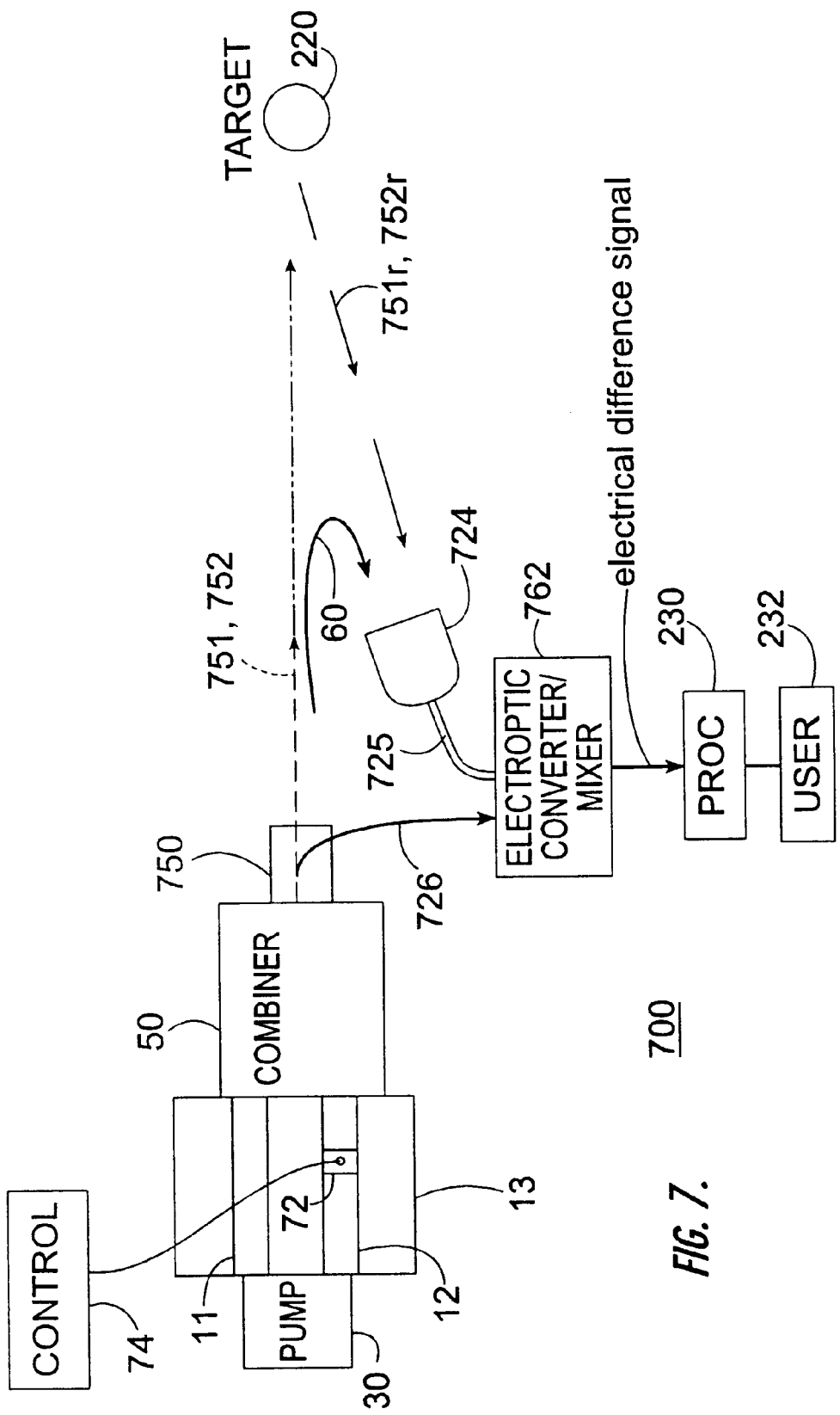
FIG. 7 is a simplified block diagram of a "light radar" system according to an aspect of the invention.

FIG. 7 is a simplified block diagram of a "light radar" system according to an aspect of the invention, in which the plural beams of laser light are transmitted toward the target and reflected, and in which the conversion to electrical form takes place in the receiver portion of the lidar. In FIG. 7, the laser pump 30, the lasers 11 and 12 on chip 13, the combiner 50, and the control voltage generator 74 are similar or identical to those of FIG. 2. the two laser light beams 51 and 52 produced at the output of power combiner 50 are transmitted through a power splitter 750 to produce transmitted light beams 751 and 752. The target 220 reflects a portion of the incident light signals 751 and 752, which returns as reflected beams 751r and 752r toward a light coupling device 724. Light coupling device 724 may be a lens or like focussing arrangement for tending to gather the light diffusely reflected from the target, or it may include an antenna-like structure such as a parabolic reflector. The received light signals 751r and 752r are coupled through an optical fiber 725 to a light-to-electric converter designated as 762. Light-to-electric converter 762 may be virtually identical to converter 62, but it has two light input ports rather than one, and it is given a different designation for that reason. Light-to-electric converter 762 also receives a sample of the transmitted light beams 751, 752 by way of a path 726. Thus, photodetector 762 receives samples of the transmitted and received light signals. Converter 762 mixes the light signals together, and produces electrical signals at frequencies including the difference frequency F described above. This difference frequency F represents the range of the target. The difference-frequency signals produced by converter 762 are processed by processor 230 and used as in block 232 in the case of an automobile collision radar. The lidar system of FIG. 7 is particularly useful for measuring or sensing ranges down into the millimeters. Consequently, it may find use in medical devices and apparatuses. In the case of such very short ranges, the pickup device may include lenses for focussing on the target. Thus, the portion of the arrangement of FIG. 7 including the power divider 750, transmit path to the target 220, return path from the target 220 to pickup device 724, device 724 (if used), and paths 725 and 726 to photodetector 762, corresponds to path 60 of FIG. 2, in that both paths couple the combined first and second laser beams to the photodetector. There are subtle differences in the operation, of the lidar of FIG. 7 by comparison with the radar of FIG. 2, in that the radar embodiment requires two photodetectors, whereas the lidar requires only one. In effect, photodetector 762 performs both the generation of the millimeter waves and beating of the millimeter waves to generate output frequency F.

Figure 8:
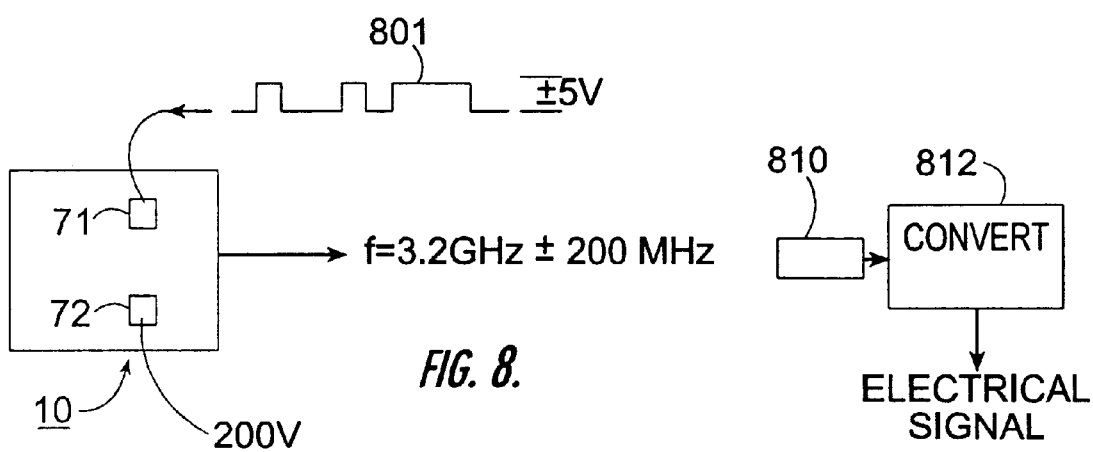
FIG. 8 is a simplified block diagram of a communication system according to an aspect of the invention.

FIG. 8 is a simplified block diagram of a communications transmitter in accordance with an aspect of the invention. In FIG. 8, device 10 of FIG. 1 is illustrated as a block, with only electrodes 71 and 72 specifically illustrated. In a communications context, the digital information signal at ±5 volts is applied to electrode 71 for modulating the first laser 11, and a constant voltage of +200 volts is applied to electrode 72 of laser 12. At a modulation sensitivity of 16 megahertz per volt (MHz/volt), the fixed voltage adjusts the center frequency of the millimeter-wave signal at 3.2 GHz, while the information signal results in a frequency-shift-keyed (FSK) modulated 3.2 GHz channel. The five-volt information signal provides 80 MHz symbol separation, which results in a maximum bit rate of about 160 Mbps. This amounts to a spectrum of about 200 MHz about the center frequency. Naturally, the exact voltage values and resulting frequencies will depend upon the parameters of the lasers. A light path designated generally as 810 may be a free-space path or an optical path such as an optical fiber (or plurality of optical fibers) terminating in one or more electrooptic converters 812. The electooptic converters 812 generate electrical signals corresponding to the information signals 801.

Figure 9:
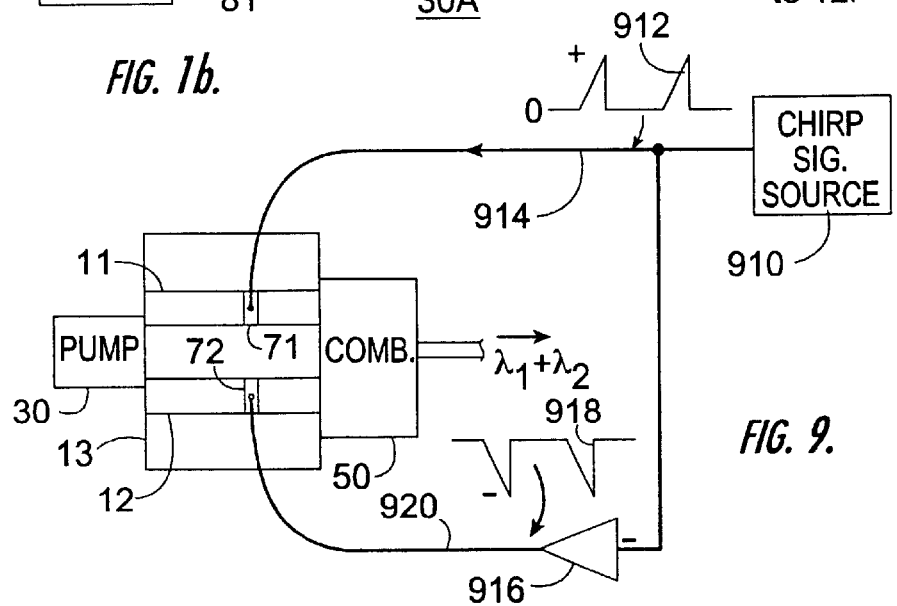
FIG. 9 illustrates how the sweep rate of a laser structure may be increased.

FIG. 9 is similar to FIG. 6, but has a ramp voltage applied to the electrooptic material of one cavity, and the inverse voltage applied to the electrooptic material of the other cavity, so that the sweep rate is doubled. In FIG. 9, a chirp signal source 910 produces positive-going ramp voltages (relative to zero volts) illustrated as 912 on a path 914, which is coupled to electrode 71 of laser 11. An inverting amplifier or converter 916 is coupled to path 914, and inverts the ramps 912 to produce inverted ramps 918, which go negative relative to 0 volts. The negative-going ramps 918 are applied to electrode 72 of laser 12. Beginning with both lasers at the same frequency or wavelength at zero volts, the frequency of one will increase while the frequency of the other decreases, thereby doubling the magnitude of the difference frequency therebetween, which also nominally doubles the chirp rate.

Other embodiments of the invention will be apparent to those skilled in the art. For example, those skilled in the art will recognize that more than two lasers can be used in systems such as those described, with a concomitant increase in light energy, so long as steps are taken to allow the laser signal powers to add. While only two lasers have been shown as being "formed" or deposited on the chip or substrate, more than two may be so applied and used. While separate transmit and receive antennas have been shown in the arrangement of FIG. 2, those skilled in the arts know that a single antenna may be substituted so long as some measures are taken to control the amount of energy flowing from the transmit port to the receive port. While the invention has been described in terms of generation of "millimeter-wave" signals, those skilled in the art will recognize that the described techniques can be used to generate signal at other wavelengths. While the described radar and lidar systems use the thermally coupled laser arrangement, separated lasers may be used, probably with some degradation in the performance. It may be desirable to use phase locking feedback techniques to lock the signal phase to a reference phase, as known in the art. While linear frequency scans have been described, nonlinear or even nonmonotonic scans can be used if the signal processing is adapted to suit. Those skilled in the art will understand that the terms "signals" and "signal" are equivalent terms, and that a singular "signal" if repeated becomes "signals."

Thus, a laser arrangement (10) according to an aspect of the invention includes a first solid-state laser (11) formed on a chip (13). The first solid-state laser (11) has a particular optical or electrooptical cavity or resonator (18) length, and at least a portion of the cavity (18) of the first solid-state laser (11) includes electrooptic material. The laser arrangement (10) also includes a second solid-state laser (12), also formed on the same chip (13), and having the same or particular cavity or resonator (28) length. At least a portion of the cavity (28) of the second solid-state laser (12) includes the electrooptic material. Ideally, the first (11) and second (12) solid-state lasers are as identical as can be achieved by the use of batch processing applied to a wafer, from which the chip (13) can be cut or broken. The purpose of forming the lasers (11, 12) on the same chip (13) is to allow them to be made as identical as possible, which also has the salient advantage of coupling them together thermally, so that changes in the environmental temperature tends to affect both the first (11) and second (12) laser diodes equally. The laser arrangement (10) includes first (31, 32, 33, 35a, 36, 35b) and second (31, 32, 33, 34) optical pumps having nominally the same pump frequency, and an optical coupling arrangement (paths 34, 35b, and ports 11i and 12i) or means (86, 87) coupled to the first (31, 32, 33, 35a, 36, 35b) and second (31, 32, 33, 34) optical pumps and to the first (11) and second (12) solid-state lasers, for pumping the first (11) and second (12) lasers with similar pump light, so that, or whereby, the first (11) and second (12) lasers produce first (41a) and second (42) laser light beams. If it were possible to make the structures identical, the laser light beams (41a, 42) should be at the same wavelength or frequency. In one avatar of the invention, the first and second pump light sources are in the form of a single pump light source (31), with an optical power divider (33, 36; 83) dividing the pump power so as to apply equal powers to the first (11) and second (12) lasers; this tends to apply changes in pump power or wavelength equally to the first and second lasers, so that the frequencies or wavelengths of the first and second light beams tend to track each other notwithstanding changes in the pump source parameters. The laser arrangement (10) also includes a light-to-electric converter (62), such as an electrooptic diode, which, in the presence of plural light signals at different frequencies or wavelengths, generates electrical signals at frequencies related to the difference. More specifically, if two laser light beams (51, 52) impinge on the diode (62), an electrical signal is produced which is at a frequency equal to the difference between the frequencies of the two light beams, and if it should happen that the frequencies of the two light beams were identical, the resulting electrical signal at the output of the diode would be zero frequency or "direct current." The laser arrangement (10) also includes a second optical coupling arrangement (60) or means ultimately coupled to the first (11) and second (11) lasers, and coupled to the light-to-electric converter, for coupling the first (51) and second (52) laser light beams to the light-to-electric converter (62), whereby the light-to-electric converter (62) generates at least one electrical difference signal. According to one aspect of the invention, in which laser arrangement is used in a ranging system or radar of the swept-frequency type (200), the second coupling path (60) may include, for example, an optical power combiner (50) or star coupler (83), together with optical fibers (86, 87) extending from the light output ports (11o, 12o) of the first (11) and second (12) lasers to input ports of the star coupler (83) for carrying the first and second laser light beams to the star coupler, and another optical fiber (81) extending from an output port of the star coupler to the electrooptic diode (62), for carrying the two laser beams to the diode; in this radar context, the electrical difference frequency generated at the diode (62) is then amplified (210), if necessary, and transmitted (antenna 212) as an electromagnetic signal (214) in the millimeter-wave frequency range. According to another aspect of the invention, the context is a lidar (light ranging) system, in which the second optical coupling path includes the optical combiner or star coupler and the light paths between the first and second lasers and the star coupler, but in which the combined first and second laser light beams at the output of the optical combiner are transmitted over the path to be measured, and reflected by the intended target. In this lidar context, the second optical coupling path also includes a receiving arrangement for picking up or sensing the reflected first and second light beams, and for conveying the reflected and returned first and second light beams to the electrooptic converter. The electrooptic converter then converts at least the first and second returned light signals into an electrical difference signal, and further processing can be performed by electronic means to determine the range of the target. According to a further aspect of the invention, an electrode is associated with at least a portion of the electrooptic material of the second laser, for, when electrically energized, electrooptically affecting the length of the cavity of the second laser, thereby affecting the wavelength of the laser light beam of the second laser, which in turn affects the frequency of the electrical difference signal at the output of the electrooptic converter.

In particularly advantageous versions of the lidar and radar embodiments, a constant electrical value, as for example a constant voltage, is applied to the electrode of the second laser, to thereby produce a constant frequency or wavelength offset of the second laser light beam relative to the first laser light beam. In these versions, the electrical value applied to the electrode coupled to the electrooptic portion of the second laser cavity is selected so that the nominal electrical difference frequency at the output of the electrooptic light-to-electric converter is closer to those frequencies at which the electronic processing devices have lowest noise. This improves the signal-to-noise ratio, thereby allowing better range resolution than if no constant electrical value were applied to the electrode of the second laser.

In yet a further manifestation of the invention, the first laser also includes an electrode coupled to the electrooptic portion of its cavity. The constant electrical value is applied to one of the first and second electrodes to provide a constant frequency or wavelength offset between the first and second laser light beams, and a ramp-like or information electrical signal(s) is applied to the other of the first and second electrodes. This has the advantage of reducing electrical coupling between the ramp- or information-signal source and the constant-value electrical source, while allowing the first and second laser light beams to be mutually offset and modulated in a useful manner.

What is claimed is:

1. A laser arrangement, comprising:
   a first solid-state laser formed on a chip, said first solid-state laser having a particular cavity length, at least a portion of said cavity of said first solid-state laser including electrooptic material;
   a second solid-state laser also formed on said chip, and having said particular cavity length, at least a portion of said cavity of said second solid-state laser including said electrooptic material;
   first and second optical pumps having nominally the same pump frequency;
   optical coupling means coupled to said first and second optical pumps and to said first and second solidstate lasers, for pumping said first and second lasers with similar pump light, whereby said first and second lasers produce first and second laser light beams;
   a light-to-electric converter which, in the presence of plural light signals at different frequencies or wavelengths, generates electrical signals at frequencies related to the difference; and
   second optical coupling means coupled to said first and second lasers, and coupled to said light-to-electric converter, for coupling said first and second laser light beams to said light-to-electric converter, whereby said light-to-electric converter generates at least one electrical difference signal.

2. An arrangement according to claim 1, further comprising:
   an electrode associated with at least a portion of said electrooptic material of said second laser, for, when electrically energized, electrooptically affecting the length of said cavity of said second laser by virtue of index of refraction effects, thereby affecting the wavelength of said laser light beam of said second laser, which in turn affects said electrical difference signal.

3. An arrangement according to claim 2, further comprising:
   an electrode associated with at least a portion of said electrooptic material of said first laser, for, when electrically energized, electrooptically affecting the length of said cavity of said first laser by virtue of index of refraction effects, thereby affecting the wavelength of said laser light beam of said first laser, which in turn affects said electrical difference signal;
   a source of fixed electrical bias coupled to said electrode associated with said second laser, and
   a source of information signal coupled to said electrode associated with said first laser, for simultaneously generating an information signal spectrum about a frequency established by said fixed bias.

4. An arrangement according to claim 1, wherein said first and second optical pumps comprise:
   a single pump light source; and
   signal dividing means coupled to said single pump light source, for dividing pump light from said single pump light source into a first portion and a second portion, corresponding to said first and second optical pumps.

5. An arrangement according to claim 4, where said signal dividing means comprises a half-silvered mirror and a prism.

6. An arrangement according to claim 4, where said signal dividing means comprises a directional coupler.

7. A radar system, said radar system comprising:
   a chirp signal source, said chirp signal source including:
   a first solid-state laser formed on a chip, said first solid-state laser having a particular optical cavity length, at least a portion of said cavity of said first solid-state laser including electrooptic material;
   a second solid-state laser also formed on said chip, and having said particular optical cavity length, at least a portion of said cavity of said second solid-state laser including said electrooptic material;
   first and second optical pumps having nominally the same pump frequency;
   optical coupling means coupled to said first and second optical pumps and to said first and second solid-state lasers, for pumping said first and second lasers with similar pump light, whereby said first and second lasers produce first and second laser light beams;
   a light-to-electric converter which, in the presence of plural light signals at different frequencies or wavelengths, generates electrical signals at frequencies related to the difference; and second optical coupling means coupled to said first and second lasers, and coupled to said light-to-electric converter, for coupling said first and second laser light beams to said light-to-electric converter, whereby said light-to-electric converter generates at least one electrical difference signal;

said radar system further comprising:

a chirp signal source coupled to said electrooptic material of at least one of said first and second lasers, for causing the frequencies of said first and second laser light beams to relatively change with time;

means for transmitting said electrical difference signal toward a target:

means for receiving at least a portion of said electrical difference signal received from said target;

mixing means coupled to said light-to-electric converter and to said means for receiving, for mixing together said electrical difference signals produced by said light-to-electric converter with said electrical difference signal received from said target, for generating a difference frequency signal indicative of the range of said target; and processing means coupled to said mixing means for evaluating said difference frequency signal indicative of the range of said target.

8. A lidar system, said lidar system comprising:

a chirp signal source, said chirp signal source including:

a first solid-state laser formed on a chip, said first solid-state laser having a particular optical cavity length, at least a portion of said cavity of said first solid-state laser including electrooptic material;

a second solid-state laser also formed on said chip, and having said particular optical cavity length, at least a portion of said cavity of said second solid-state laser including said electrooptic material;

first and second optical pumps having nominally the same pump frequency;

optical coupling means coupled to said first and second optical pumps and to said first and second solid-state lasers, for pumping said first and second lasers with similar pump light, whereby said first and second lasers produce first and second laser light beams;

a light-to-electric converter which, in the presence of plural light signals at different frequencies or wavelengths, generates electrical signals at frequencies related to the difference; and second optical coupling means coupled to said first and second lasers, and coupled to said light-to-electric converter, for coupling said first and second laser light beams to said light-to-electric converter by way of a target, whereby said light-to-electric converter generates at least one electrical difference signal;

said lidar system further comprising:

a chirp signal source coupled to said electrooptic material of at least one of said first and second lasers for causing said first and second laser light beams to change in frequency relative to each other;

means for transmitting said first and second laser light beams toward a target: means for receiving at least a portion of said first and second light beams received from said target; and processing means coupled to said light-to-electric converter for evaluating said difference frequency signal indicative of the range of said target.

9. A communication system, said communication system comprising:

a chirp signal source, said chirp signal source including:

a first solid-state laser formed on a chip, said first solid-state laser having a particular optical cavity length, at least a portion of said cavity of said first solid-state laser including electrooptic material;

a second solid-state laser also formed on said chip, and having said particular optical cavity length, at least a portion of said cavity of said second solid-state laser including said electrooptic material;

first and second optical pumps having nominally the same pump frequency;

optical coupling means coupled to said first and second optical pumps and to said first and second solid-state lasers, for pumping said first and second lasers with similar pump light, whereby said first and second lasers produce first and second laser light beams;

a light-to-electric converter which, in the presence of plural light signals at different frequencies or wavelengths, generates electrical signals at frequencies related to the difference; and second optical coupling means coupled to said first and second lasers, and coupled to said light-to-electric converter, for coupling said first and second laser light beams to said light-to-electric converter, whereby said light-to-electric converter generates at least one electrical difference signal;

said communication system further comprising:

an information signal source coupled to said electrooptic material of at least one of said first and second lasers for causing said electrical difference signal to be responsive to said information;

and means for receiving at least a portion of said electrical difference signal, and for extracting said information from said electrical difference signal.

* * * * *